United States Patent
Desai et al.

(10) Patent No.: US 9,726,689 B1
(45) Date of Patent: *Aug. 8, 2017

(54) WAFER LEVEL MICRO-ELECTRO-MECHANICAL SYSTEMS PACKAGE WITH ACCELEROMETER AND GYROSCOPE

(71) Applicant: Maxim Integrated Products, Inc., San Jose, CA (US)

(72) Inventors: Hemant Desai, Gilbert, AZ (US); Peter Harper, Gilroy, CA (US); Demetre Kondylis, Saratoga, CA (US)

(73) Assignee: Hanking Electronics Ltd., Solon, OH (US)

( * ) Notice: Subject to any disclaimer, the term of this patent is extended or adjusted under 35 U.S.C. 154(b) by 372 days.

This patent is subject to a terminal disclaimer.

(21) Appl. No.: 14/067,727

(22) Filed: Oct. 30, 2013

Related U.S. Application Data

(60) Provisional application No. 61/798,117, filed on Mar. 15, 2013, provisional application No. 61/798,552, (Continued)

(51) Int. Cl.
  *G01P 1/02* (2006.01)
  *H01L 29/84* (2006.01)
  (Continued)

(52) U.S. Cl.
  CPC ........ *G01P 15/0802* (2013.01); *B81C 1/0023* (2013.01); *B81C 1/00269* (2013.01);
  (Continued)

(58) Field of Classification Search
  CPC ...... G01P 15/0802; G01P 1/023; B81B 7/007; B81B 7/02; B81C 1/00269;
  (Continued)

(56) References Cited

U.S. PATENT DOCUMENTS

| 7,263,883 B2 * | 9/2007 | Park | G01C 19/56 73/431 |
| 8,342,021 B2 * | 1/2013 | Oshio | G01C 19/56 73/493 |

(Continued)

OTHER PUBLICATIONS

Premachandran et al., "A Novel, Wafer-Level Stacking Method for Low-Chip Yield and Non-Uniform, Chip-Size Wafers for MEMS and 3D SIP Applications", IEEE, Electronic Components and Technology Conference, 2008.*

*Primary Examiner* — Helen Kwok
(74) *Attorney, Agent, or Firm* — Hartman Global IP Law; Gary M. Hartman; Domenica N. S. Hartman

(57) ABSTRACT

The invention relates to sensors, and more particularly, a sensor device having accelerometer and gyroscope integrated into a low cost compact package. The device includes: MEMs wafer; and an ASIC wafer bonded to the MEMs wafer; a wafer-level-package redistribution layer (WLP RDL) formed on a surface of the ASIC wafer; and a ball grid array having a plurality of solder balls that electrically connect the package to a circuit board. The MEMs wafer includes the accelerometer and gyroscope, while the ASIC wafer includes two separate cavities corresponding to the accelerometer and gyroscope, respectively. The ASIC wafer includes electrical circuits/components to process the readout signals received from the accelerometer and gyroscope.

6 Claims, 3 Drawing Sheets

Related U.S. Application Data filed on Mar. 15, 2013, provisional application No. 61/798,942, filed on Mar. 15, 2013.

(51) Int. Cl.
*G01P 15/08* (2006.01)
*B81C 1/00* (2006.01)

(52) U.S. Cl.
CPC ....... *G01P 1/023* (2013.01); *B81C 2203/0118* (2013.01); *G01P 2015/0862* (2013.01)

(58) Field of Classification Search
CPC .............. B81C 1/00238; B81C 1/0023; B81C 1/00246; B81C 1/00301
USPC ..................................... 73/493, 431; 257/415
See application file for complete search history.

(56) References Cited

U.S. PATENT DOCUMENTS

| | | | |
|---|---|---|---|
| 8,429,969 B2* | 4/2013 | Yamanaka | B81B 7/02 73/493 |
| 8,653,634 B2* | 2/2014 | Chiu | H01L 24/97 257/415 |
| 9,156,673 B2* | 10/2015 | Bryzek | H01L 29/84 |
| 2004/0063237 A1* | 4/2004 | Yun | B81C 1/00357 438/48 |
| 2005/0103105 A1* | 5/2005 | Emmerich | B81B 7/0048 73/493 |
| 2006/0180896 A1* | 8/2006 | Martin | B60C 23/0408 257/619 |
| 2008/0079120 A1* | 4/2008 | Foster | B81B 7/007 257/619 |
| 2008/0116569 A1* | 5/2008 | Huang | H01L 23/36 257/712 |
| 2009/0007661 A1* | 1/2009 | Nasiri | G01P 1/023 73/504.03 |
| 2010/0290199 A1* | 11/2010 | Schmid | B81C 1/0023 361/752 |
| 2011/0031565 A1* | 2/2011 | Marx | G01C 19/5712 257/417 |
| 2011/0049652 A1* | 3/2011 | Wu | B81C 1/00246 257/417 |
| 2011/0057273 A1* | 3/2011 | O'Donnell | B81C 1/0023 257/414 |
| 2013/0168740 A1* | 7/2013 | Chen | B81C 1/00238 257/254 |
| 2013/0242493 A1* | 9/2013 | Shenoy | H01L 23/49827 361/679.21 |
| 2014/0150553 A1* | 6/2014 | Feyh | G01P 15/0802 73/514.31 |
| 2014/0227816 A1* | 8/2014 | Zhang | B81C 1/00333 438/48 |

\* cited by examiner

WAFER LEVEL MICRO-ELECTRO-MECHANICAL SYSTEMS PACKAGE WITH ACCELEROMETER AND GYROSCOPE

CROSS REFERENCE TO RELATED APPLICATIONS

This application claims the benefit of U.S. Provisional Application Nos. 61/798,117, entitled "Wafer level micro-electro-mechanical systems package with accelerometer and gyroscope," filed Mar. 15, 2013, 61/798,552, entitled "Wafer level micro-electro-mechanical systems package with accelerometer, gyroscope, and magnetometer," filed Mar. 15, 2013, 61/798,942, entitled "Wafer level micro-electro-mechanical systems package with accelerometer and gyroscope," filed Mar. 15, 2013, which applications are hereby incorporated herein by reference in their entireties.

BACKGROUND

A. Technical Field

The present invention relates to a sensor, and more particularly, to a device having multiple sensors integrated into a low cost compact package.

B. Background of the Invention

Conventional accelerometers and gyroscopes have been widely applied to measure acceleration and rate of rotation of an object, where an accelerometer and gyroscope are implemented in the object by micro-electro-mechanical-systems (MEMS) technology. The object may include various handheld devices, such as cell phones and electronic game controllers. FIG. 1A shows a schematic diagram 100 of a conventional sensor package having a gyroscope and an accelerometer for measuring the motion of an object in 6-degrees of freedom. As depicted, the conventional sensor package includes: a MEMS wafer 102 having an accelerometer and a gyroscope for measuring the acceleration and angular rate of an object; a glass interposer 104 bonded to the MEMS wafer 102 by a sealing mechanism; a dielectric layer 106 attached to the glass interposer 104; a flip chip Application Specific Integrated Circuit (FC ASIC) 122 attached to the dielectric layer 106 by one or more flip chip solder bumps 124; and a ball grid array (BGA) 120 for electrically connecting the package 100 to a circuit board (not shown in FIG. 1A).

FIG. 1B shows the bottom view of the sensor package 100. As depicted, the dielectric layer 106 may include traces 132 for connecting the BGA 120 to the FC ASIC 122 and FC solder bumps 124.

The glass interposer 104 may be formed of a glass. The signal from the accelerometer and gyroscope is transmitted to the FC ASIC 122 through the vias 108 and 110 and flip chip solder bumps 124. The FC ASIC 122 includes electrical components to process the signal readout of the accelerometer and gyroscope.

The convention sensor package 100 has several drawbacks. First, it includes the glass interposer 104, which increases the form factor of the package in the z-direction (height) and the manufacturing cost of the package. Also, the glass interposer 104 includes vias 108, increasing the fabrication cost and structural complexity. Second, the solder balls of the BGA (or, equivalently, pins) 120 should be large enough to provide sufficient standoff, D, so that the FC ASIC 122 would not touch the surface of circuit board to which the BGA 120 is soldered. This size requirement for the BGA 120 adds extra form factor in the z-direction. Third, if additional pins are to be implemented, the x-y footprint of the package 100 should be increased to accommodate the additional pins since the x-y footprint of the FC ASIC 122 cannot be compromised. Thus, the x-y footprint of the package 100 is determined by the dimension of the glass interposer 104, not by the dimension of the FC ASIC 122, increasing the overall form factor of the package 100.

Therefore, a better solution is needed to address the main issues, including the form factor, manufacturing cost, and structural complexity of the conventional sensor package.

SUMMARY OF THE INVENTION

According to one aspect of the present invention, a device having multiple sensors integrated in a micro-electro-mechanical system (MEMS) wafer package includes: a micro-electro-mechanical system (MEMS) wafer including one or more sensors; and an application-specific-integrated-circuit (ASIC) wafer bonded to the MEMS wafer and configured to electrically communicate to the sensors.

According to one aspect of the present invention, a method for fabricating a sensor device includes: etching an application-specific-integrated-circuit (ASIC) wafer to form one or more cavities; forming one or more sensors in a micro-electro-mechanical system (MEMS) wafer; and bonding the ASIC wafer to the MEMS wafer, the cavities being aligned with the sensors so that active components of the sensors are able to freely move inside the cavities.

These and other advantages and features of the invention will become apparent to those persons skilled in the art upon reading the details of the invention as more fully described below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Various embodiments of the invention relate to a sensor package, and more particularly, to a sensor package including an accelerometer and a gyroscope for measuring the motion of an object in 6-degrees of freedom. The package includes a MEMs wafer having an accelerometer, a gyroscope, and micro-through-silicon-vias (µTSV). The MEMs wafer is bonded to an ASIC wafer, to thereby eliminate the glass interposer of the conventional sensor packages and to reduce the overall thickness of the package. Also, by eliminating the glass interposer, the x-y footprint of the package is not affected by the footprint of the glass interposer. Instead, the x-y footprint of the package is determined by the footprint of the ASIC. In addition, as the BGA is attached to the bottom surface of the ASIC, the variation of the pin number can be achieved without changing the x-y footprint of the sensor package. The signal readout of the accelerometer and gyroscope is transmitted to the ASIC wafer through the µTSV of the ASIC wafer, where the ASIC processes the signal readout.

Figure 1A:
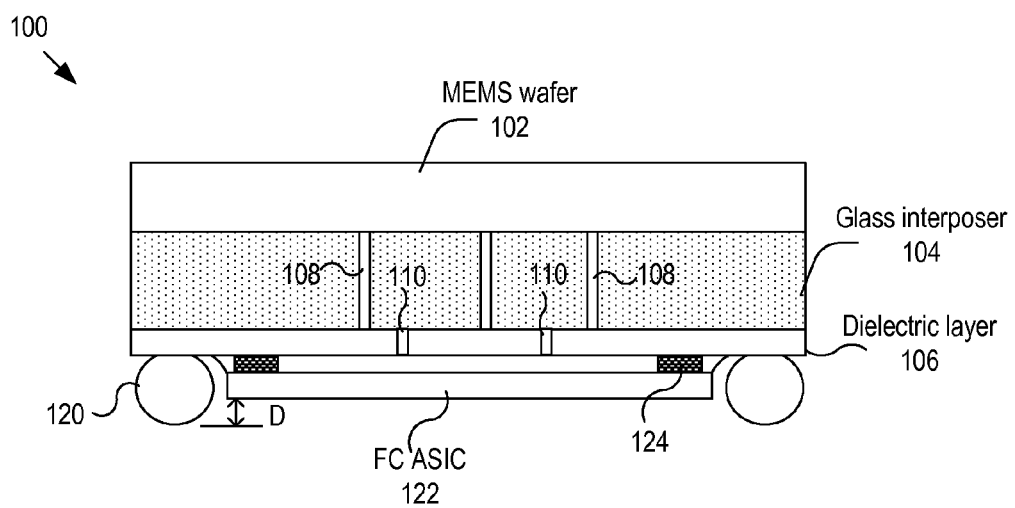
FIG. 1A illustrates a schematic diagram of a conventional sensor package.
Figure 1B:
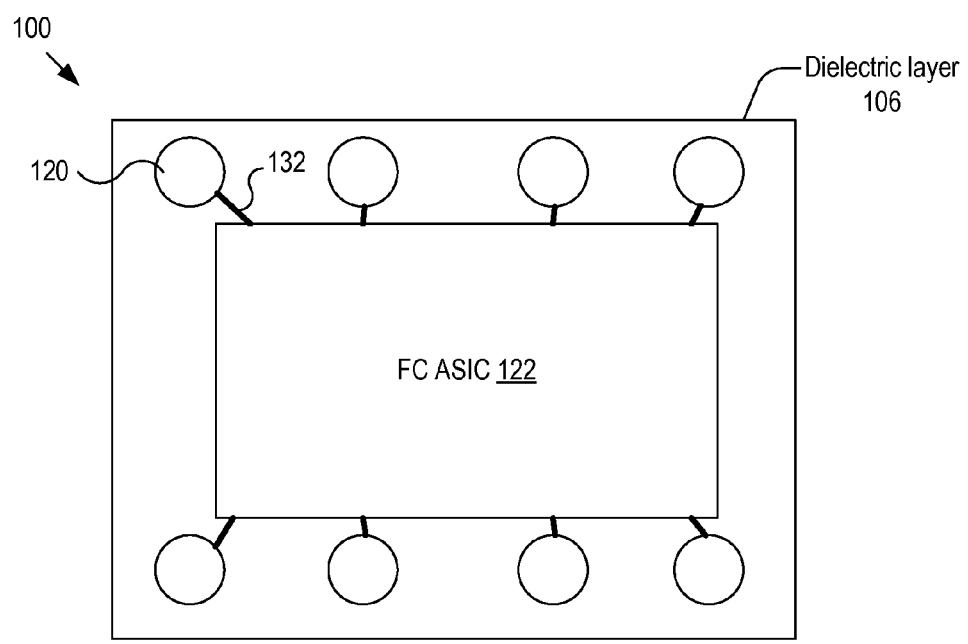
FIG. 1B illustrates a bottom view of the conventional sensor package in FIG. 1A.
Figure 2A:
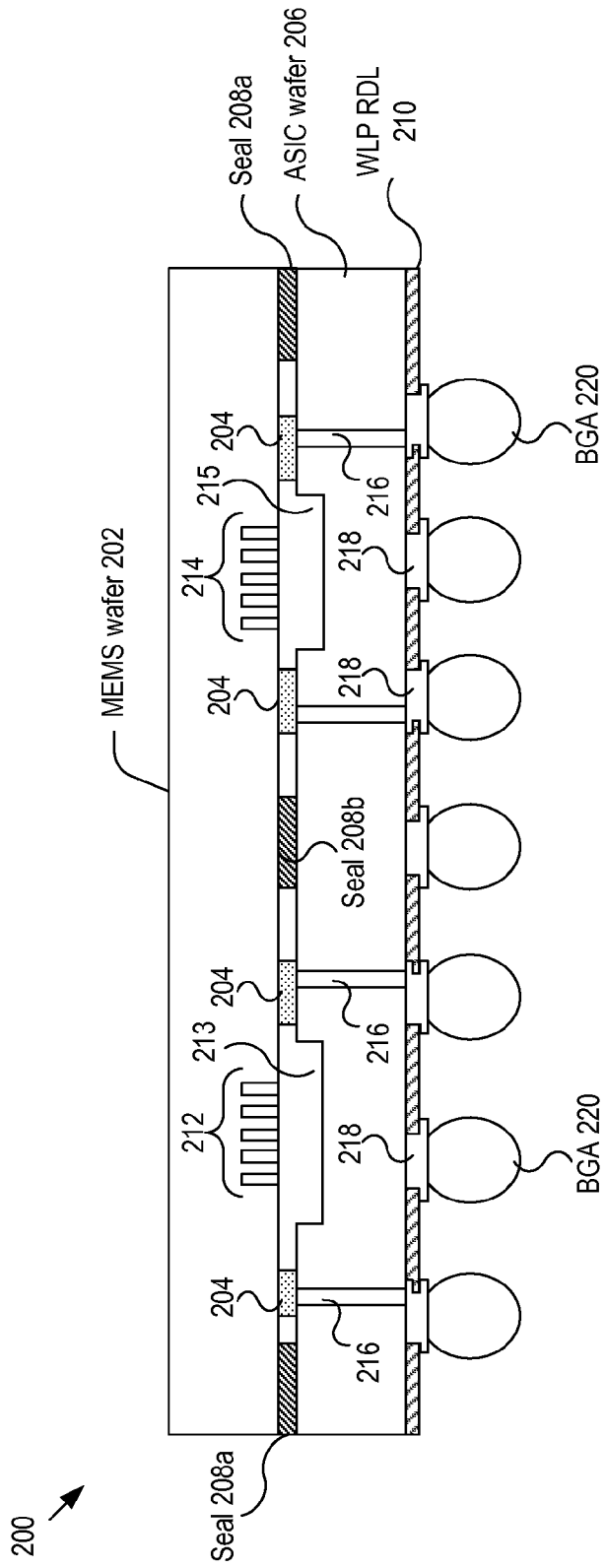
FIG. 2A illustrates a schematic diagram of a sensor package according to one embodiment of the present invention.

FIG. 2A illustrates an exemplary block diagram 200 of a sensor package for measuring acceleration and rate of rotation in 6-degrees of freedom according to one embodiment of the present invention. As depicted, the sensor package 200 includes: a MEMs wafer 202; and an ASIC wafer 206 bonded to the MEMs wafer 202; a wafer-level-package redistribution layer (WLP RDL) 210 formed on a surface of the ASIC wafer 206; and a ball grid array (BGA) 220 having a plurality of solder balls that electrically connect the package 200 to a circuit board (not shown in FIG. 2A).

The MEMs wafer 202, which is preferably formed of a single silicon wafer, includes the accelerometer 212 and gyroscope 214 that are formed by etching the bottom portion of the wafer. For instance, the accelerometer 212 may have a cantilever comb structure that is formed by conventional wafer fabrication techniques. In general, the bottom side portion of the MEMs wafer 202 may include additional structures, such as traces and electrodes, to communicate electrical signals and readout data of the sensors 212 and 214 to the ASIC wafer 206. Conventional wafer fabrication techniques may be used to form the additional structures.

The ASIC wafer 206, which is preferably formed of a silicon wafer, is designed for processing the readout signals from the accelerometer 212 and gyroscope 214. For example, the ASIC wafer 206 includes analog circuits, analog-to-digital converter, microprocessor, and digital data processing circuits to process the readout signals of the accelerometer 212 and gyroscope 214. These electrical components may be formed on the bottom side of the ASIC 206 by conventional wafer fabrication techniques, such as etching and depositing layers. The ASIC wafer 206 also includes a plurality of micro-through-silicon-vias (µTSV) 216, by a conventional etching technique.

The ASIC wafer 206 further includes two cavities 213 and 215 that correspond to the accelerometer 212 and gyroscope 214, respectively, and are formed by a conventional etching technique. The cavities 213 and 215 provide space for the accelerometer 212 and gyroscope 214, respectively, so that the active components of these sensors can freely move without touching the surface of the ASIC wafer 206.

The ASIC wafer 206 is bonded to MEMs wafer 202 by suitable sealing mechanisms 208a and 208b, such as Au/Si eutectic seal. The electrical contacts 204, such as Au/Si electrical contact, provide electrical connection between the µTSV 216 and the sensors 212 and 214. The electrical contacts 204, such as Au/Si electrical contacts, may provide both mechanical and electrical contacts between ASIC wafer 206 and the MEMs wafer 202.

It is noted that the two cavities 213 and 215 are used instead of one large cavity that may cover both the accelerometer 212 and gyroscope 214. The sealing mechanism 208a and 208b maintains the two cavities 213 and 215 at two different internal pressures so that active components of the accelerometer 212 and gyroscope 214 can operate at the intended internal pressures. In one embodiment, the accelerometer 212 may need lower pressure than the gyroscope 214. In another embodiment, the internal pressure of the cavities may be lower than the atmospheric pressure since the air inside the cavities may dampen the motion of active components of these sensors. The two cavities 213 and 215 are separated by the bonding mechanism 208b to thereby prevent fluid communication therebetween and to maintain two different internal pressures thereinside.

A wafer level package redistribution layer (WLP RDL) 210 is formed on the bottom surface of the ASIC 206 and includes traces that interconnect the µTVS 216 to the electrical components formed on the ASIC wafer 206. The electrical components of the ASIC 206 for processing the readout signal from the accelerometer 212 and gyroscope 214 are formed on the side facing the WLP RDL 210. The BGA 220 connects the traces and vias 218 formed in the WLP RDL 210 to a circuit board (not shown in FIG. 2A).

Figure 2B:
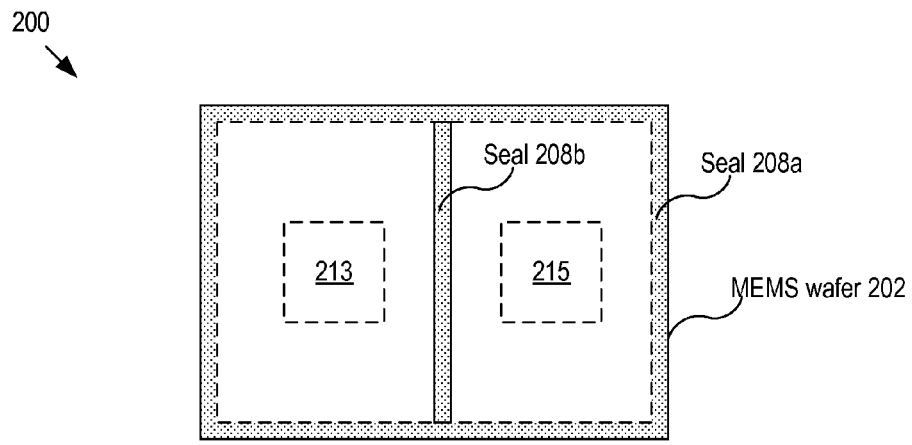
FIG. 2B illustrates a top view of the sensor package in FIG. 2A.

FIG. 2B shows a top view of the sensor package 200 in FIG. 2A. As depicted, the sealing mechanisms 208a and 208b are used to maintain two different pressures inside the cavities 213 and 215.

It is noted that the BGA 220 is attached to the bottom surface of the WLP RDL 210. This structure allows the designer of the package 200 to increase pin count density without increasing the overall x-y footprint of the package 200. Also, unlike the convention sensor packages, the designer can increase the size of the ASIC 206 without depopulating the BGA 220, providing a significant advantage in designing the sensor package.

Figure 3:
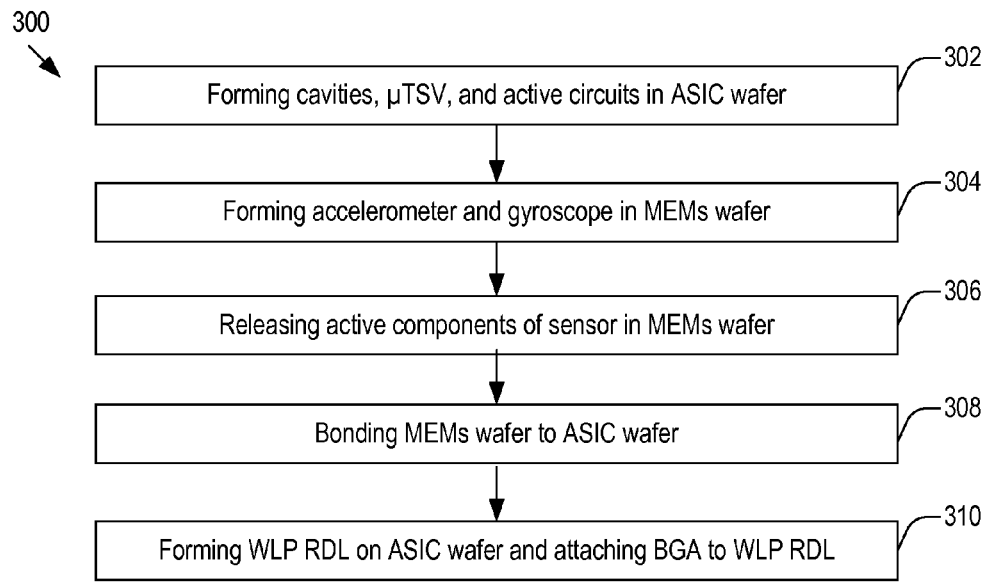
FIG. 3 is a flowchart of an illustrative process for fabricating the sensor package in FIG. 2A according to another embodiment of the present invention.

FIG. 3 is a flowchart 300 of an illustrative process for fabricating the sensor package 200 according to another embodiment of the present invention. The process begins at a step 302 by etching the ASIC wafer 206 to form cavities 213 and 215 and forming µTSV 216 and other suitable electrical circuits/components for processing the readout signals from the accelerometer 212 and gyroscope 214. The cavities 213 and 215, µTSV 216, and the other suitable electrical circuits/components may be formed by suitable conventional wafer fabricating techniques.

Then, at a step 304, conventional wafer fabrication techniques are used to form the accelerometer 212, gyroscope 214 and other electrical components in the MEMs wafer 202. It is noted that the active components of the accelerometer 212 and gyroscope 214 may be very delicate and easily damaged by inadvertent contact during the fabrication process. Thus, the active components of these sensors remain attached to the main body of the MEMs wafer 202 in the step 304.

Next, at a step 306, the active components of the accelerometer 212 and gyroscope 214 in the MEMs wafer 202 are released from the main body of the MEMs wafer 202 so that these components can freely move relative to the main body. In one embodiment, hydrofluoric (HF) acid may be used to release the components. Subsequently, at a step 308, the MEMs wafer 202 is bonded to the ASIC wafer 206 by suitable bonding mechanism, such as Au/Si eutectic sealing at ~370° C.

As discussed above, the accelerometer 212 and gyroscope 214 may operate at two different internal pressures since the gas inside the cavities may dampen the motion of active components of the accelerometer 212 and gyroscope 214. In such a case, the seal 208b may separate the cavity 213 from the cavity 215 so that the cavities have different pressures after bonding the MEMs wafer 202 to the ASIC wafer 206. Also, in the step 308, a plurality of electrical contacts 204, such as Au/Si contacts, are also used to bond the MEMs wafer 202 securely to the ASIC wafer 206.

Finally, at a step 310, the WLP RDL 210 is formed on the ASIC surface, and the BGA 220 is attached to the WLP RDL 210. It is noted that the steps 302-310 are performed on a wafer containing a plurality of identical sensor packages. Thus, after the step 310, the wafer is diced into individual sensor packages and tested.

It should be understood, of course, that the foregoing relates to exemplary embodiments of the invention and that modifications may be made without departing from the spirit and scope of the invention as set forth in the following claims.

What is claimed is:

1. A device, comprising:
a micro-electro-mechanical system (MEMS) wafer that is formed of one monolithic body devoid of a via hole and comprises first and second sensors formed on one side of the MEMS wafer, the first and second sensors each including an active component;
an application-specific-integrated-circuit (ASIC) wafer bonded to the MEMS wafer and configured to electrically communicate to the first and second sensors, the ASIC wafer includes first and second cavities in a first surface thereof, the first and second cavities providing space for the first and second sensors, respectively, so that the active components of the first and second sensors freely move within the first and second cavities without touching the ASIC wafer;
first and second electrical contacts providing electrical connection between the ASIC wafer and the MEMS wafer; and
sealing mechanisms that bond the ASIC wafer to the MEMS wafer and separate the first cavity and the first electrical contact from the second cavity and the second electrical contact, the sealing means preventing fluid communication between the first and second cavities.

2. A device as recited in claim 1, further comprising:
a wafer-level-package redistribution layer (WLP RDL) disposed directly on the ASIC wafer and positioned on a second surface of the ASIC wafer on an opposite side to the MEMS wafer; and
a ball-grid-array (BGA) bonded to the WLP RDL.

3. A device as recited in claim 1, wherein gas pressures inside the first and second cavities are different from each other.

4. A device as recited in claim 2, wherein the electrical contacts provide both mechanical and electrical connections between the MEMS wafer and the ASIC wafer.

5. A device as recited in claim 4, wherein the ASIC wafer includes vias providing electrical communication between the BGA and the electrical contacts.

6. A device as recited in claim 1, wherein the first and second sensors include a gyroscope and an accelerometer.

* * * * *